United States Patent
Eguchi et al.

(10) Patent No.: US 8,488,332 B2
(45) Date of Patent: Jul. 16, 2013

(54) FUNCTION EXPANSION DEVICE, MANUFACTURING METHOD THEREOF AND ELECTRONIC APPARATUS SYSTEM

(75) Inventors: Susumu Eguchi, Kawasaki (JP); Hiroshi Shimamori, Kawasaki (JP); Yusaku Fujiishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 437 days.

(21) Appl. No.: 12/567,289

(22) Filed: Sep. 25, 2009

(65) Prior Publication Data

US 2010/0079969 A1    Apr. 1, 2010

(30) Foreign Application Priority Data

Sep. 30, 2008    (JP) ................... 2008-252936

(51) Int. Cl.
*H05K 1/00*    (2006.01)
*H05K 1/14*    (2006.01)
*H05K 1/11*    (2006.01)

(52) U.S. Cl.
USPC ............................ 361/803; 361/748; 361/818

(58) Field of Classification Search
USPC ........................ 361/803, 748, 818
See application file for complete search history.

(56) References Cited

U.S. PATENT DOCUMENTS

| | | | | |
|---|---|---|---|---|
| 4,591,945 A * | 5/1986 | Ugon | ............................ | 361/212 |
| 4,707,040 A * | 11/1987 | Hansel, III | ..................... | 439/510 |
| 5,085,601 A * | 2/1992 | Buchter et al. | ................ | 439/660 |
| 5,692,910 A | 12/1997 | Mittal | | |
| 5,947,749 A * | 9/1999 | Rathburn | ........................ | 439/66 |
| 6,094,361 A * | 7/2000 | Batten et al. | .................. | 361/816 |
| 6,855,891 B2 * | 2/2005 | Eguchi et al. | ................. | 174/250 |
| 2001/0009505 A1 * | 7/2001 | Nishizawa et al. | ........... | 361/737 |
| 2005/0013106 A1 * | 1/2005 | Takiar | ........................... | 361/684 |
| 2007/0128891 A1 * | 6/2007 | Ling | .............................. | 439/55 |

FOREIGN PATENT DOCUMENTS

| | | | |
|---|---|---|---|
| JP | 57-102086 A | | 6/1982 |
| JP | 57-104478 A | | 6/1982 |
| JP | 9-7709 A | | 1/1997 |
| JP | 2002158067 A | * | 5/2002 |
| JP | 2002171040 A | * | 6/2002 |
| JP | 2003-142791 A | | 5/2003 |
| KR | 2006014721 A | * | 2/2006 |

* cited by examiner

*Primary Examiner* — Timothy Thompson
*Assistant Examiner* — Nathan Milakovich
(74) *Attorney, Agent, or Firm* — Fujitsu Patent Center

(57) ABSTRACT

A function expansion device is electrically connected to an electronic apparatus by being inserted in a socket included in the electronic apparatus and expands a function of the electronic apparatus. The function expansion device includes a substrate on which a component is mounted, a first connecting terminal that is formed at an end portion of the substrate and is electrically connected to a first signal line that connects the electronic apparatus and the component in a one-to-one fashion, a second connecting terminal that is formed at the end portion of the substrate and is electrically connected to a second signal line that connects the electronic apparatus and the component redundantly, and a protection member that is formed to cover only the second connecting terminal.

10 Claims, 15 Drawing Sheets

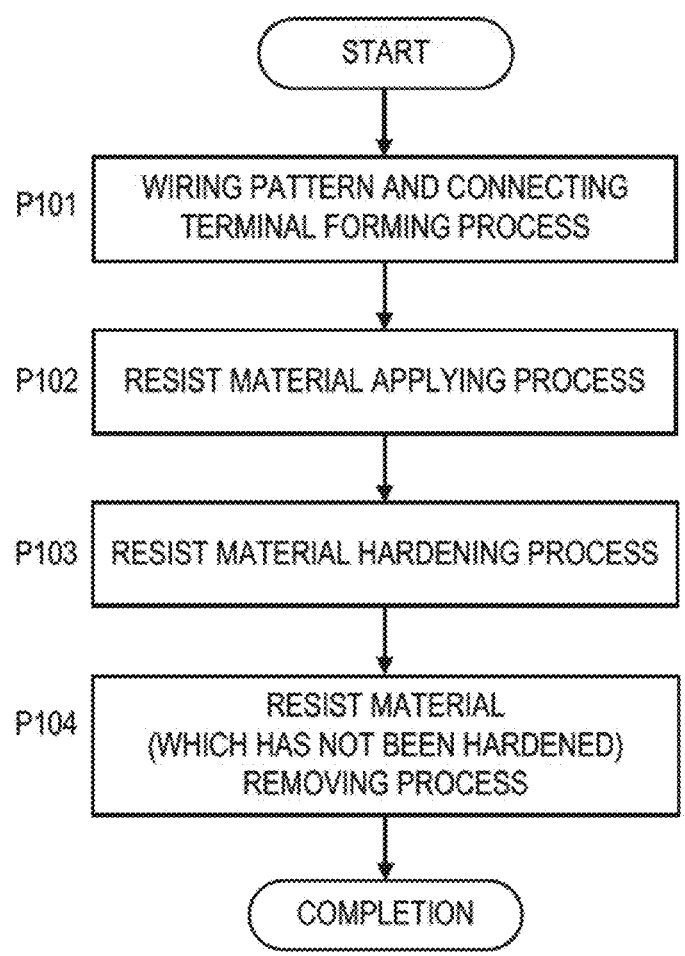

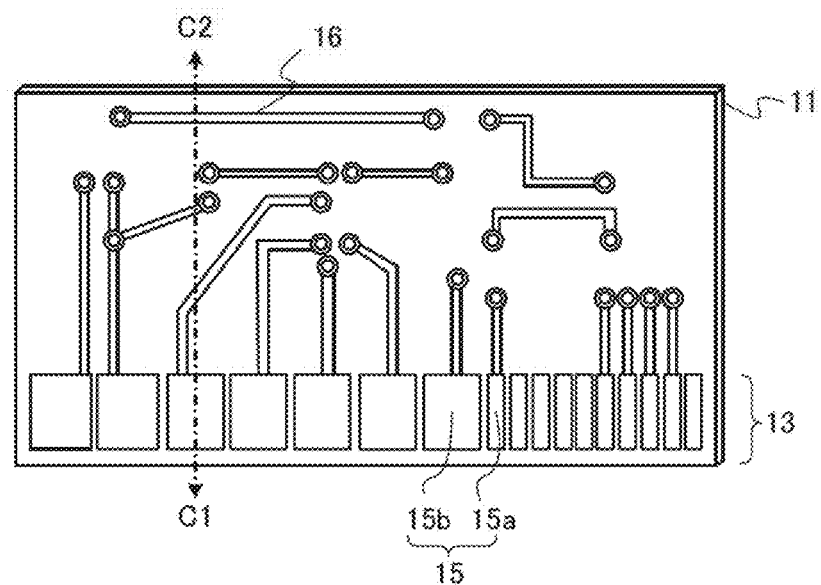
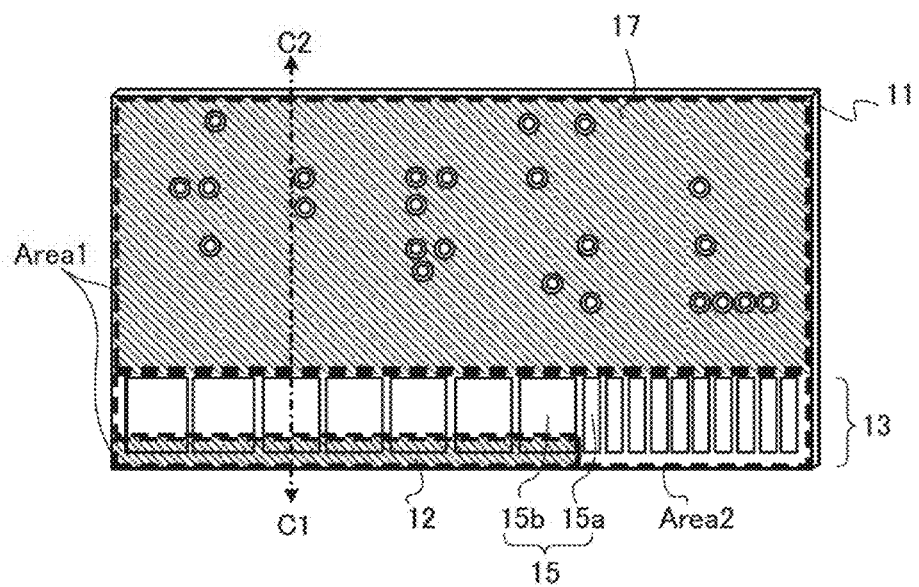

FIG. 13

| Pin # | Description | Description | Pin |
|---|---|---|---|
| 1 | 48Vin | 48Vrtn | 70 |
| 2 | 48Vin | 48Vrtn | 69 |
| 3 | 48Vin | 48Vrtn | 68 |
| 4 | Reserved(removed for VID) | Reserved(removed for 12Vout) | 67 |
| 5 | Reserved(removed for 5Vout) | Reserved | 66 |
| 6 | Reserved($I^2C$ Data) | Reserved($I^2C$ Clock) | 65 |
| 7 | D2D OK# | D2DPRES# | 64 |
| 8 | Reserved | VID4 | 63 |
| 9 | VID3 | VID2 | 62 |
| 10 | VID1 | VID0 | 61 |
| 11 | Reserved | Ishare | 60 |
| 12 | PWRGD | OUTEN | 59 |
| 13 | Reserved | Reserved | 58 |
| 14 | Reserved | Reserved | 57 |
| 15 | SENSE- | SENSE+ | 56 |
| 16 | Vout- | Vout- | 55 |
| 17 | Vout- | Vout- | 54 |
| 18 | Vout+ | Vout+ | 53 |
| 19 | Vout+ | Vout+ | 52 |
| 20 | Vout- | Vout- | 51 |
| 21 | Vout- | Vout- | 50 |
| 22 | Vout+ | Vout+ | 49 |
| 23 | Vout+ | Vout+ | 48 |
| 24 | Vout- | Vout- | 47 |
| 25 | Vout- | Vout- | 46 |
| 26 | Vout+ | Vout+ | 45 |
| 27 | Vout+ | Vout+ | 44 |
| 28 | Vout- | Vout- | 43 |
| 29 | Vout- | Vout- | 42 |
| 30 | Vout+ | Vout+ | 41 |
| 31 | Vout+ | Vout+ | 40 |
| 32 | Vout- | Vout- | 39 |
| 33 | Vout- | Vout- | 38 |
| 34 | Vout+ | Vout+ | 37 |
| 35 | Vout+ | Vout+ | 36 |

| | |
|---|---|
| Ishare | Current Share pin. |
| OUTEN | Output Enable. |
| Vin | Input Voltage. |
| Vout orVout+ | Output Voltage. |
| 48Vrtn | Input ground return. |
| SENSE+ | Output voltage remote sensing to achieve proper regulation at the load points. |
| SENSE- | Output voltage ground return remote sensing to achieve proper regulation at the load points. |
| Vout- | Output ground return. |

FIG. 14B

PIN CONFIGURATIONS (Front side/back side)

| Pin Front | | Pin Front | | Pin Front | | Pin Back | | Pin Back | | Pin Back | |
|---|---|---|---|---|---|---|---|---|---|---|---|
| 1 | VSS | 29 | DQM1 | 57 | DQ18 | 85 | VSS | 113 | DQM5 | 141 | DQ50 |
| 2 | DQ0 | 30 | CS0 | 58 | DQ19 | 86 | DQ32 | 114 | CS1 | 142 | DQ51 |
| 3 | DQ1 | 31 | DU | 59 | VDD | 87 | DQ33 | 115 | RAS | 143 | VDD |
| 4 | DQ2 | 32 | VSS | 60 | DQ20 | 88 | DQ34 | 116 | VSS | 144 | DQ52 |
| 5 | DQ3 | 33 | A0 | 61 | NC | 89 | DQ35 | 117 | A1 | 145 | NC |
| 6 | VDD | 34 | A2 | 62 | VREF | 90 | VDD | 118 | A3 | 146 | VREF |
| 7 | DQ4 | 35 | A4 | 63 | CKE1 | 91 | DQ36 | 119 | A5 | 147 | NC |
| 8 | DQ5 | 36 | A6 | 64 | VSS | 92 | DQ37 | 120 | A7 | 148 | VSS |
| 9 | DQ6 | 37 | A8 | 65 | DQ21 | 93 | DQ38 | 121 | A9 | 149 | DQ53 |
| 10 | DQ7 | 38 | A10/AP | 66 | DQ22 | 94 | DQ39 | 122 | BA0 | 150 | DQ54 |
| 11 | VSS | 39 | BA1 | 67 | DQ23 | 95 | DQ40 | 123 | A11 | 151 | DQ55 |
| 12 | VSS | 40 | VDD | 68 | VSS | 96 | VSS | 124 | VDD | 152 | VSS |
| 13 | DQ9 | 41 | VDD | 69 | DQ24 | 97 | DQ41 | 125 | CLK1 | 153 | DQ56 |
| 14 | DQ10 | 42 | CLK0 | 70 | DQ25 | 98 | DQ42 | 126 | A12 | 154 | DQ57 |
| 15 | DQ11 | 43 | VSS | 71 | DQ26 | 99 | DQ43 | 127 | VSS | 155 | DQ58 |
| 16 | DQ12 | 44 | DU | 72 | DQ27 | 100 | DQ44 | 128 | CKE0 | 156 | DQ59 |
| 17 | DQ13 | 45 | CS2 | 73 | VDD | 101 | DQ45 | 129 | CS3 | 157 | VDD |
| 18 | VSS | 46 | DQM2 | 74 | DQ28 | 102 | VDD | 130 | DQM6 | 158 | DQ60 |
| 19 | DQ14 | 47 | DQM3 | 75 | DQ29 | 103 | DQ46 | 131 | DQM7 | 159 | DQ61 |
| 20 | DQ15 | 48 | DU | 76 | DQ30 | 104 | DQ47 | 132 | A13 | 160 | DQ62 |
| 21 | CB0 | 49 | VDD | 77 | DQ31 | 105 | CB4 | 133 | VDD | 161 | DQ63 |
| 22 | CB1 | 50 | NC | 78 | VSS | 106 | CB5 | 134 | NC | 162 | VSS |
| 23 | VSS | 51 | NC | 79 | CLK2 | 107 | VSS | 135 | NC | 163 | CLK3 |
| 24 | NC | 52 | CB2 | 80 | NC | 108 | NC | 136 | CB6 | 164 | NC |
| 25 | NC | 53 | CB3 | 81 | NC | 109 | NC | 137 | CB7 | 165 | SA0 |
| 26 | VDD | 54 | VSS | 82 | SDA | 110 | VDD | 138 | VSS | 166 | SA1 |
| 27 | WE | 55 | DQ16 | 83 | SCL | 111 | CAS | 139 | DQ48 | 167 | SA2 |
| 28 | DQM0 | 56 | DQ17 | 84 | VDD | 112 | DQM4 | 140 | DQ49 | 168 | VDD |

PIN NAMES

| PIN NAME | Function |
|---|---|
| A0-A11 | Address input (Multiplexed) |
| BA0-BA1 | Select bank |
| DQ0-DQ83 | Data input/output |
| CB0-7 | Check bit (Data-in/data-out) |
| CLK0-CLK3 | Clock input |
| CKE0-CKE1 | Clock enable input |
| CS0-CS3 | Chip select input |
| RAS | Row address strobe |
| CAS | Column address strobe |
| WE | Write enable |
| DQM0-7 | DQM |
| VDD | Power supply (3.3V) |
| VSS | Ground |
| VREF | Power supply for reference |
| SDA | Serial data I/O |
| SCL | Serial clock |
| SA0-2 | Address in EEPROM |
| DU | Don't use |
| NC | No connection |

US 8,488,332 B2

FUNCTION EXPANSION DEVICE, MANUFACTURING METHOD THEREOF AND ELECTRONIC APPARATUS SYSTEM

CROSS-REFERENCE TO RELATED APPLICATION

This application is based upon and claims priority to prior Japanese Patent Application No. 2008-252936 filed on Sep. 30, 2008 in the Japan Patent Office, the entire contents of which are incorporated herein by reference.

FIELD

The embodiments of the present invention relate to a function expansion device, a method of manufacturing the function expansion device, and an electronic apparatus system.

BACKGROUND

One example of a function expansion device is a printed wiring electronic card. When mounting such an electronic card on an electronic apparatus, it is typical to adopt the following method. Namely, an edge connector is provided on an end of the electronic card, and the edge connector is inserted in a socket of the electronic apparatus.

The edge connector includes terminals for electrical connection (hereinafter referred to as a "connecting terminal") formed, in accordance with a given pattern, on the end of the electronic card. The socket includes wire-shaped terminals for electrical connection (hereinafter referred to as a "receiving terminal") at positions corresponding to the connecting terminals of the edge connector when the edge connector is inserted therein. Upon insertion of the edge connector in the socket, the receiving terminals of the socket make contact with the connecting terminals of the edge connector, and thus electrical connection is established between a printed wiring substrate and the electronic apparatus.

Since the connecting terminals of the edge connector come in contact with the receiving terminals of the socket, a certain amount of force is needed in inserting the edge connector in the socket. Due to this, damage is caused at the edge connector or in the socket by forcible insertion.

To reduce insertion force when inserting the edge connector in the socket, there has been discussed a technique in which shapes of the edge connector and/or the connecting terminals are processed, or a technique in which protection members are provided adjacent to the end portions of all the connecting terminals of the edge connector.

[Patent Document 1] Japanese Laid-Open Patent Application 2003-142791
[Patent Document 2] Japanese Laid-Open Patent Application Hei 9-7709
[Patent Document 3] Japanese Laid-Open Patent Application Sho 57-102086
[Patent Document 4] Japanese Laid-Open Utility Model Application Sho 57-104478

SUMMARY

According to an aspect of the invention, a function expansion device is electrically connected to an electronic apparatus by being inserted in a socket included in the electronic apparatus and expands a function of the electronic apparatus. The function expansion device includes a substrate on which a component is mounted, a first connecting terminal that is formed at an end portion of the substrate and is electrically connected to a first signal line that connects the electronic apparatus and the component in a one-to-one fashion, a second connecting terminal that is formed at the end portion of the substrate and is electrically connected to a second signal line that connects the electronic apparatus and the component redundantly, and a protection member that is formed to cover only the second connecting terminal.

BRIEF DESCRIPTION OF DRAWINGS

FIG. 10 illustrates a flowchart indicating one example of a method of manufacturing the function expansion device according to the embodiments;
FIGS. 11A and 11B illustrate plane views indicating one example of the function expansion device as a part of manufacturing processes;
FIG. 13 illustrates one example of assignment tables for connecting terminals of a DC/DC converter module with reference to the A-D2D standard;
and
FIG. 14A illustrates a plane view indicating one example of a DIMM and
FIG. 14B illustrates one example of assignment tables for connecting terminals of the DIMM.

DESCRIPTION OF THE PREFERRED EMBODIMENTS

Hereinafter examples of embodiments will be disclosed with reference to the drawings.

First, a function expansion device 10 according to a first embodiment will be disclosed with reference to FIGS. 1 through 6.

Figure 1:
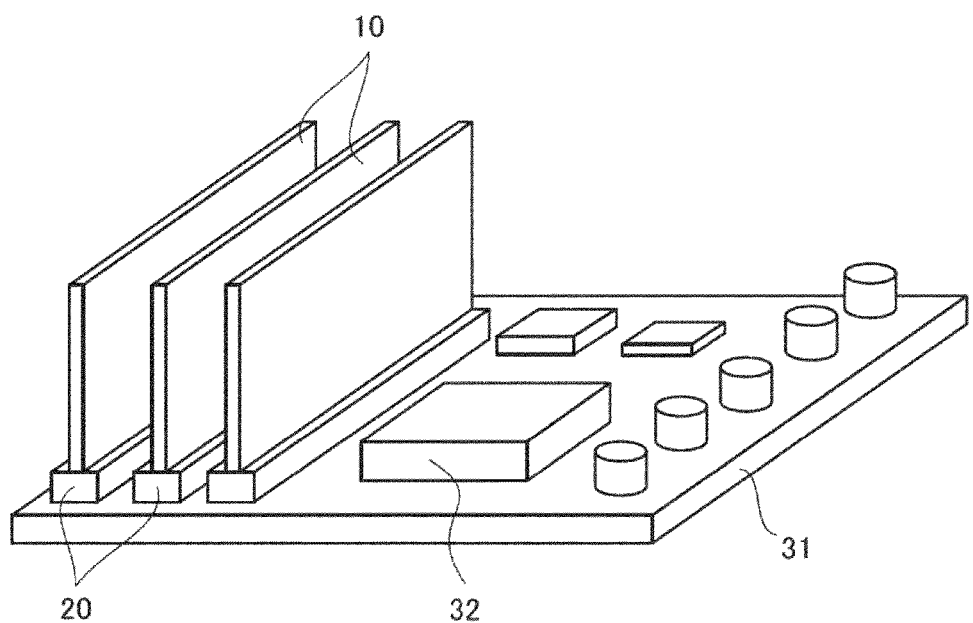
FIG. 1 illustrates a perspective view of one preferred example of an electronic apparatus electrically connected to a function expansion device according to embodiments.

FIG. 1 illustrates a perspective view indicating one preferred example of an electronic apparatus that is electrically connected to a function expansion device (10) according to the first embodiment.

The electronic apparatus is, for example, an information processing apparatus. In the electronic apparatus, for example, an LSI chip 32 and a plurality of sockets 20 are mounted on a board 31. The function expansion devices 10 according to the first embodiment are inserted in the sockets 20. The function expansion device 10 is, for example, a card-like-shaped electronic card. A power supply module, a memory module, a CPU module, a network adapter or the like, may also be considered as examples of the function expansion device 10. The function expansion device 10 is electrically connected to the electronic apparatus by inserting a connector portion of the function expansion device 10 in the socket 20. This allows an electronic apparatus system with expanded functions to be configured.

Figure 2:
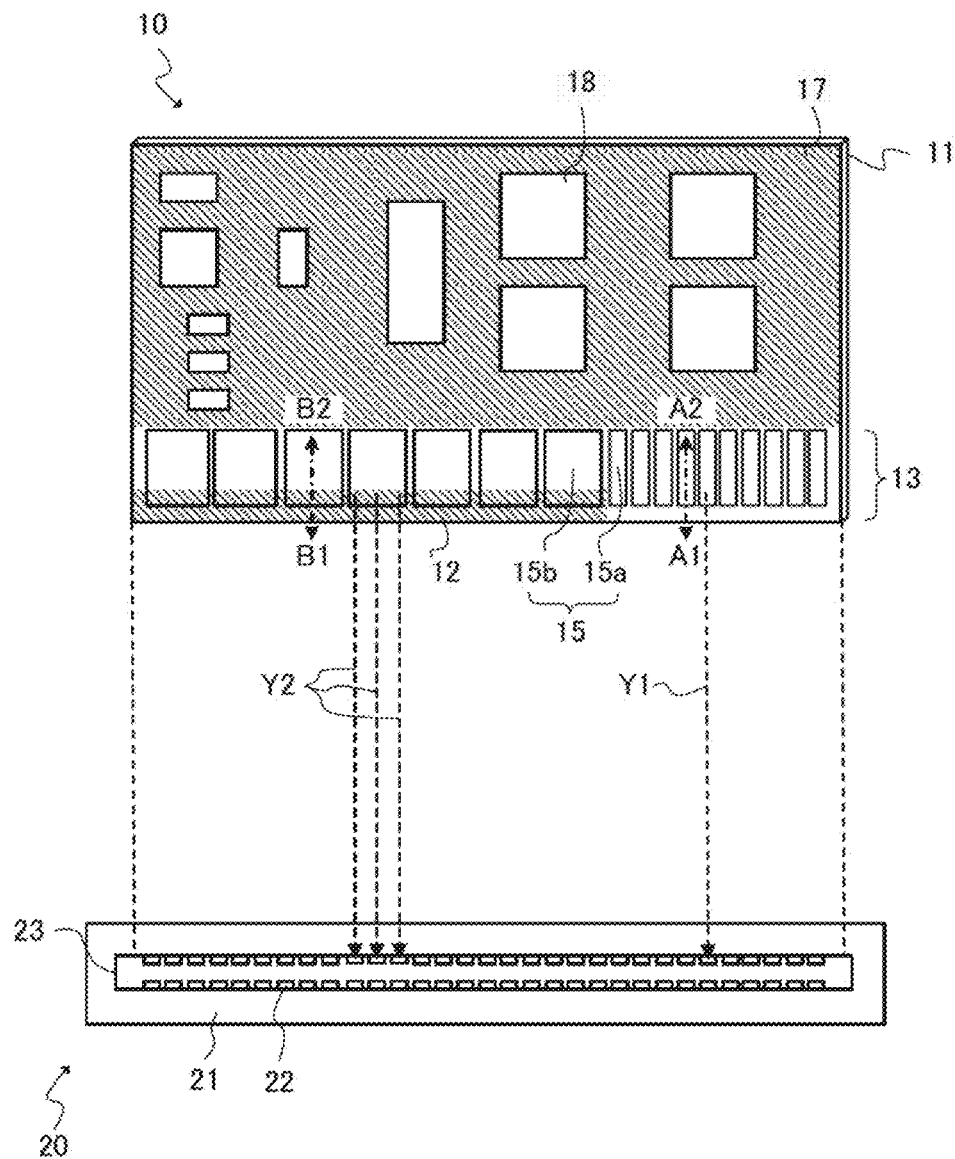
FIG. 2 illustrates a plane view of the function expansion device and a socket according to a first embodiment.

FIG. 2 illustrates a plane view indicating one example of the function expansion device 10 and the socket 20 according to the first embodiment.

The function expansion device 10 includes a connector portion 13 (that is, an edge connector) at an end portion of a substrate 11 formed of, for example, a glass epoxy resin or the like. Wiring patterns of circuit wirings are printed on a part except the connector portion 13 on the substrate 11. The wiring patterns are covered with a protective resist 17 applied on the substrate 11. A variety of IC chips 18 provided over a surface of the substrate 11 covered with the protective resist 17 are electrically connected to the circuit wirings. The connector portion 13 of the substrate 11 is formed in such a manner that the connector portion 13 of the substrate 11 matches the size and shape of an opening 23 of the socket 20. At end portions on both sides of the connector portion 13 in the substrate 11, connecting terminals 15 are formed in a given pattern. The connecting terminals 15 may be formed by etching copper foil laminated on the substrate 11. A surface of the connector portion 13 is divided into a right area and a left area. First connecting terminals 15a are formed on one area, and second connecting terminals 15b are formed on the other area.

The socket 20 has a shape with the opening 23 being provided on a socket body 21. Inside the opening 23 of the socket 20, there is provided a plurality of wire-shaped receiving terminals 22. The plurality of receiving terminals 22 are arranged such that the receiving terminals 22 are positioned to match the connecting terminals 15 of the connector portion 13 inserted in the socket 20. By inserting the connector portion 13 of the substrate 11 in the opening 23 of the socket 20, the receiving terminals 22 are attached, by pressure, to the connecting terminals 15 formed on both surfaces of the connector portion 13, so that electrical connection is established between the connecting terminals 15 and the receiving terminals 22. By virtue thereof, the function expansion device 10 is electrically connected to the electronic apparatus, and this allows the functions of the electronic apparatus to be expanded.

As indicated by FIG. 2, the second connecting terminal 15b is formed wider in width than the first connecting terminal 15a. For this reason, in inserting the connector portion 13 in the socket 20, the number of receiving terminals 22 making contact with the second connecting terminals 15b is greater than the number of receiving terminals 22 making contact with the first connecting terminals 15a. For instance, with regard to the example in FIG. 2, as indicated by the dotted arrow line Y1, the first connecting terminal 15a makes contact with one (1) receiving terminal 22. On the other hand, as indicated by the dotted arrow line Y2, the second connecting terminal 15b makes contact with three (3) receiving terminals 22. As a result, the first connecting terminal 15a forms only one (1) electrical connection path to the electronic apparatus. On the other hand, the second connecting terminal 15b forms three (3) electrical connection paths to the electronic apparatus. An example of the function expansion device 10 having such a terminal structure is a power supply module. In the power supply module, for example, the second connecting terminal 15b may function as a power supply terminal which supplies a power source or a grounding terminal which serves as a reference of a ground potential.

Figure 3A:
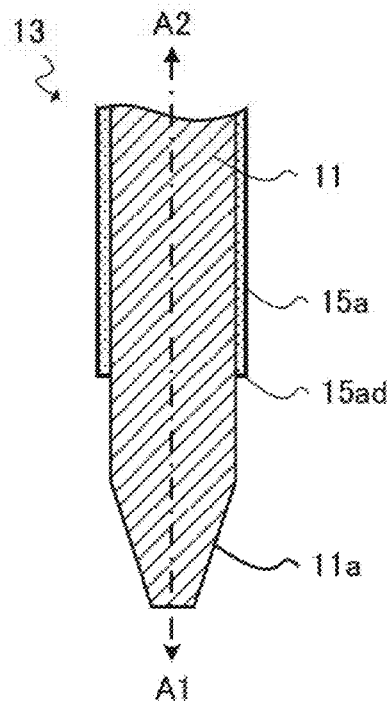
FIGS. 3A and 3B illustrate sectional views each of which indicates a connector portion.
Figure 3B:
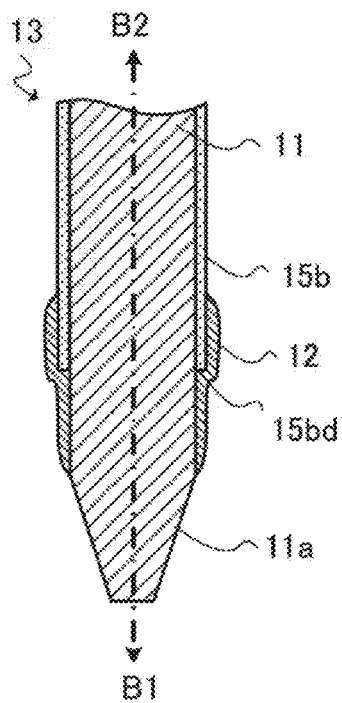

FIGS. 3A and 3B illustrate sectional views each of which indicates one example of the connector portion 13. FIG. 3A illustrates the sectional view taken along the section line A1-A2 in FIG. 2, that is to say, the sectional view of a portion where the first connecting terminals 15a in the connector portion 13 are formed. FIG. 3B illustrates the sectional view taken along the section line B1-B2 in FIG. 2, that is to say, the sectional view of a portion where the second connecting terminals 15b in the connector portion 13 are formed.

As indicated by FIGS. 3A and 3B, a tip of the connector portion 13 of the substrate 11 is chamfered by which edges of the tip are removed, so that a tapered surface 11a is formed. By virtue thereof, insertion of the connector portion 13 in the socket 20 is facilitated.

At an end portion 15bd of the second connecting terminal 15b, there is provided a protection member 12. More specifically, a protection member 12 is provided adjacent to the end portion 15bd of the second connecting terminal 15b. By providing the protection member 12 adjacent to the end portion 15bd of the second connecting terminal 15b, not only protecting the end portion 15bd of the second connecting terminal 15b against shock or the like may be achieved, but also reducing insertion force when inserting the connector portion 13 in the socket 20 may be achieved with a reduction in the friction coefficient. In the example indicated by FIG. 3B, the protection member 12 is provided not only adjacent to the second connecting terminal 15b but also in such a manner that the protection member 12 covers the end portion 15bd of the second connecting terminal 15b. By virtue thereof, the effect of reducing the insertion force of the connector portion 13 may be further improved. The protection member 12 is formed by also applying a resist material on the end portion 15bd of the second connecting terminal 15b when the resist material is applied to the wiring patterns on the substrate 11. On the other hand, the protection member 12 is not provided on an end portion 15ad of the first connecting terminal 15a.

Figure 4A:
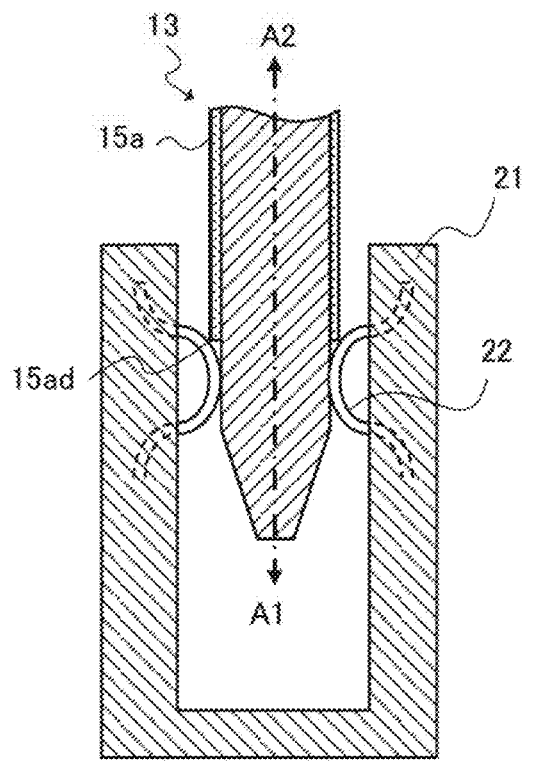
FIGS. 4A and 4B illustrate sectional views each of which indicates a state where the connector portion is inserted in a socket 20.
Figure 4B:
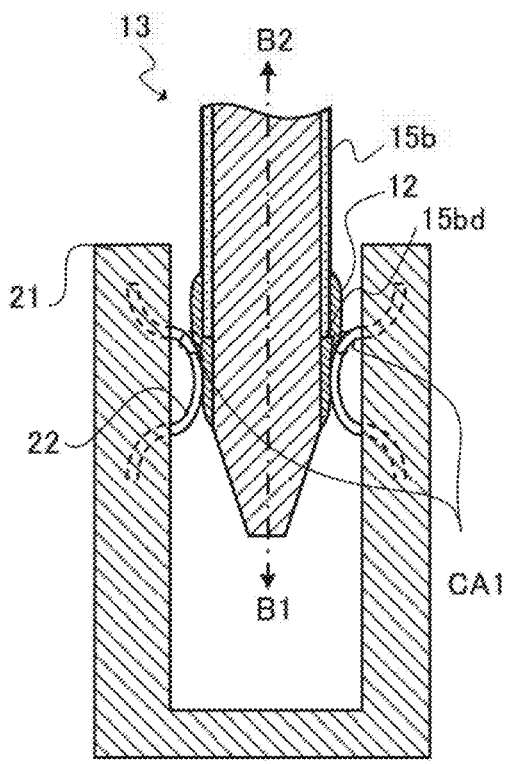

FIGS. 4A and 4B illustrate sectional views each of which indicates an example of a state where the connector portion 13 is inserted in the socket 20. FIG. 4A illustrates the sectional view indicating a state where a portion on which the first connecting terminal 15a in the connector portion 13 is provided is inserted. FIG. 4B illustrates the sectional view indicating a state where a portion on which the second connecting terminal 15b in the connector portion 13 is provided is inserted. FIG. 4A and FIG. 4B illustrate a sectional view of the connector portion 13.

Figure 4C:
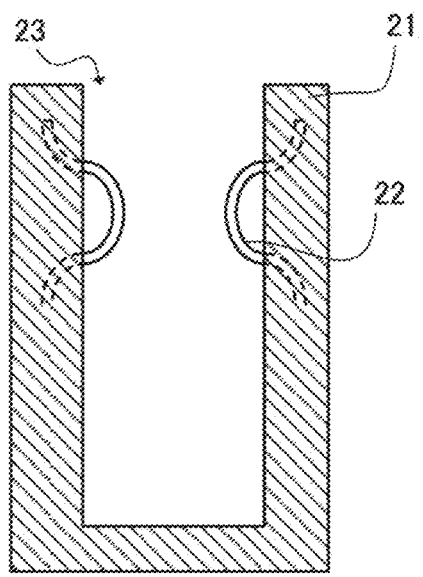
FIGS. 4C illustrate sectional views each of the connector portion of a socket body 21.

As indicated by FIG. 4C, a plurality of wire-shaped receiving terminals 22 is provided in such a manner that the receiving terminal 22 projects from the socket body 21 inwardly toward the inside of the opening 23 of the socket 20 so that the wire-shaped receiving terminal 22 is capable of making contact with the connecting terminal 15 of the connector portion 13. By virtue thereof, upon inserting the connector portion 13 in the socket 20, the connector portion 13 comes in contact with the receiving terminal 22. Consequently, in order to completely insert the connector portion 13 in the socket 20, an insertion force strong enough to accommodate the contact force between the connector portion 13 and the socket 20 is necessary.

More specifically, upon inserting the connector portion 13 in the socket 20, as indicated by FIG. 4A, the end portion 15ad of the first connecting terminal 15a comes in contact with the receiving terminal 22 at the portion on which the first connecting terminal 15a in the connector portion 13 is provided. On the other hand, as indicated by FIG. 4B, the protection member 12 comes in contact with the receiving terminal 22 at the portion on which the second connecting terminal 15b in the connector portion 13 is provided.

Since the protection member 12 is provided adjacent to the end portion 15bd of the second connecting terminal 15b at the portion on which the second connecting terminal 15b in the connector portion 13 is provided, the end portion 15bd of the second connecting terminal 15b is not directly in contact with the receiving terminal 22. Consequently, the reduction in insertion force may be achieved in comparison to a case where the protection member 12 is not provided at the portion on which the second connecting terminal 15b in the connector portion 13 is provided. However, there is a possibility that a part of the protection member 12, for example, enclosed by the dashed line CA1 is scraped off by the receiving terminal 22 due to the contact between the protection member 12 and the receiving terminal 22, at the portion on which the second connecting terminal 15b in the connector portion 13 is provided. On the other hand, since the protection member 12 is not provided at the portion on which the first connecting terminal 15a in the connector portion 13 is provided, there is no such possibility.

Figure 5A:
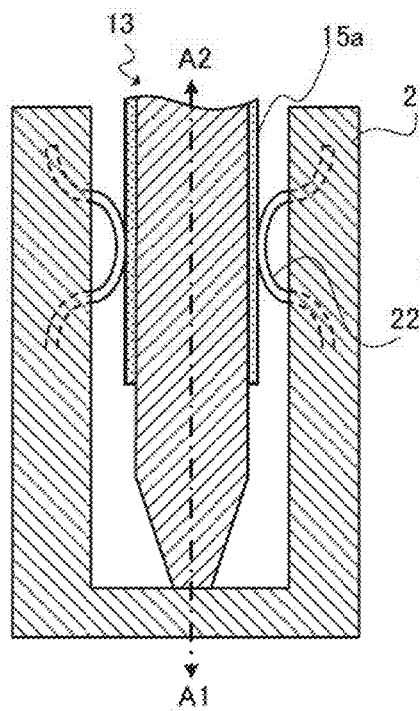
FIGS. 5A and 5B illustrate sectional views each of which indicates a state where the connector portion is completely inserted in the socket 20.
Figure 5B:
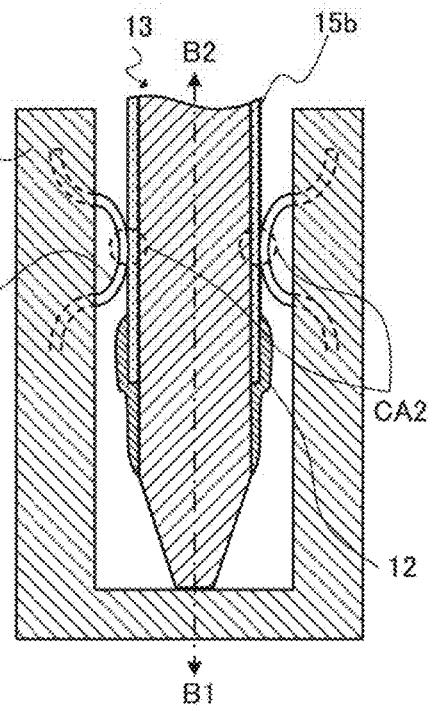

FIGS. 5A and 5B illustrate sectional views each of which indicates an example of a state where the connector portion 13 is completely inserted in the socket 20. FIG. 5A illustrates the sectional view indicating a state where the portion on which the first connecting terminal 15a in the connector portion 13 is provided is completely inserted. FIG. 5B illustrates the sectional view indicating a state where the portion on which the second connecting terminal 15b in the connector portion 13 is provided is completely inserted.

As indicated by FIGS. 5A and 5B, upon complete insertion of the connector portion 13 in the socket 20, the first connecting terminal 15a and the second connecting terminal 15b come in contact with the receiving terminal 22. By virtue thereof, electrical connection is established between the first connecting terminal 15a and the receiving terminal 22 and between the second connecting terminal 15b and the receiving terminal 22, respectively.

However, if a part of the protection member 12 is scraped off by the receiving terminal 22 when the connector portion 13 is inserted in the socket 20, there is a possibility that flakes, which are scraped off, may be caught between the second connecting terminal 15b and the receiving terminal 22 (for example, at positions enclosed by the dashed line CA2). On the other hand, the protection member 12 is not provided at the portion on which the first connecting terminal 15a in the connector portion 13 is provided. Consequently, there is no possibility that the flakes of the protection member 12 are caught therebetween at the portion on which the first connecting terminal 15a in the connector portion 13 is provided.

Figure 6:
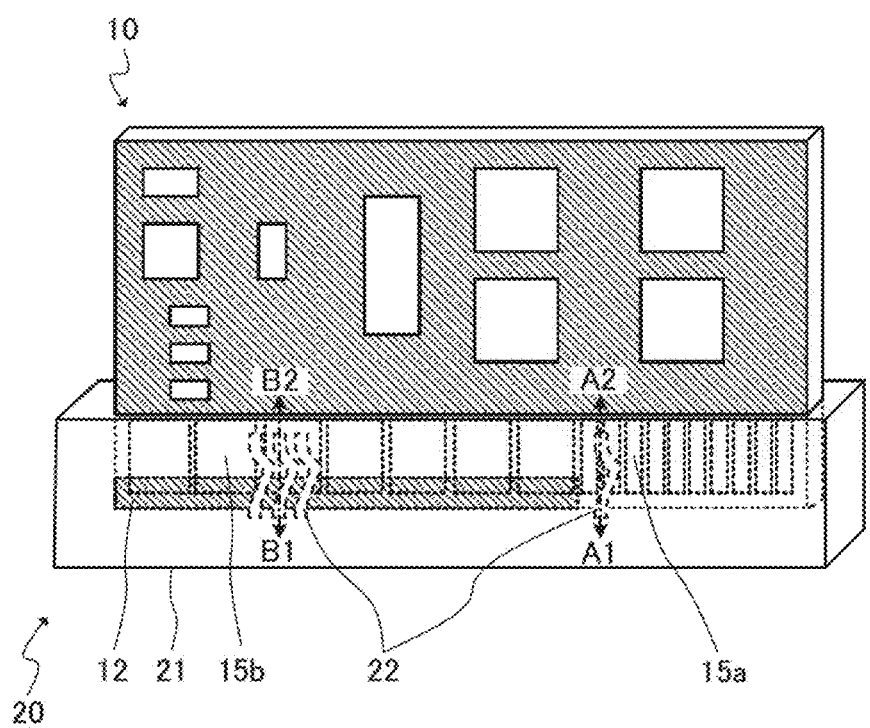
FIG. 6 illustrates a transparent view indicating one example of a state where the connector portion is completely inserted in the socket 20.

FIG. 6 illustrates a transparent view indicating one example of a state where the connector portion 13 is completely inserted in the socket 20. Only a part of the receiving terminals 22 in the plurality of receiving terminals 22 disposed inside the socket 20 are illustrated in FIG. 6.

As indicated by FIG. 6, in the state where the connector portion 13 is completely inserted in the socket 20, the first connecting terminal 15a comes in contact with only one (1) receiving terminal 22, and the second connecting terminal 15b comes in contact with three (3) receiving terminals 22. In consequence, three (3) electrical connection paths are established between the second connecting terminal 15b and the electronic apparatus. For this reason, even if an electrical-contact failure is caused due to the flakes of the protection member 12 having been caught between one (1) or two (2) out of the three receiving terminals 22 and the second connecting terminal 15b, electrical connection is maintained between the second connecting terminal 15b and the remaining receiving terminals 22.

On the other hand, the first connecting terminal 15a having a narrower width than the second connecting terminal 15b comes in contact with one (1) receiving terminal 22. In consequence, the number of electrical connection paths established between the second connecting terminal 15b and the electronic apparatus is just one (1). However, the protection member 12 is not provided at the end portion (15ad) of the first connecting terminal 15a. By virtue thereof, there is no possibility that the electrical-contact failure is caused by the flakes of the protection member 12 becoming caught between the first connecting terminal 15a and the receiving terminal 22.

The protection member 12 is not provided at the end portion (15ad) of the first connecting terminal 15a connected to just one receiving terminal 22, whereas the protection member 12 is provided only at the end portion (15bd) of the second connecting terminal 15b connected to more than one receiving terminal 22, in the function expansion device 10 according to the first embodiment disclosed above. By virtue thereof, the insertion force may be reduced owing to the protection member 12 thus formed, in comparison to a function expansion device where no protection member is formed. On the other hand, since no protection member is provided on the first connecting terminal 15a, the electrical-contact failure due to the flakes scraped off from the protection member may be prevented. Moreover, an influence on an operation of the function expansion device 10 may be reduced, if not suppressed, even if the electrical-contact failure caused due to the flakes of the protection member 12 becoming caught between, for example, one (1) of receiving terminals 22 and the second connecting terminal 15b, in the function expansion device 10 according to the first embodiment. It is because that the electrical connection may be maintained between the remaining receiving terminals 22 except the one (1) receiving terminal 22 and the second connecting terminal 15b even in the case disclosed above.

Hereinafter a function expansion device 10a according to a second embodiment will be disclosed with reference to FIGS. 7 and 8. The function expansion device 10a according to the second embodiment is also, for example, a card-like-shaped electronic card in the same or similar manner to the function expansion device 10 according to the first embodiment. The function expansion device 10a is electrically connected to an electronic apparatus by inserting a connector portion 13 (that is, an edge connector of the function expansion device 10a) in a socket 20, and this allows the functions of the electronic apparatus to be expanded.

Figure 7:
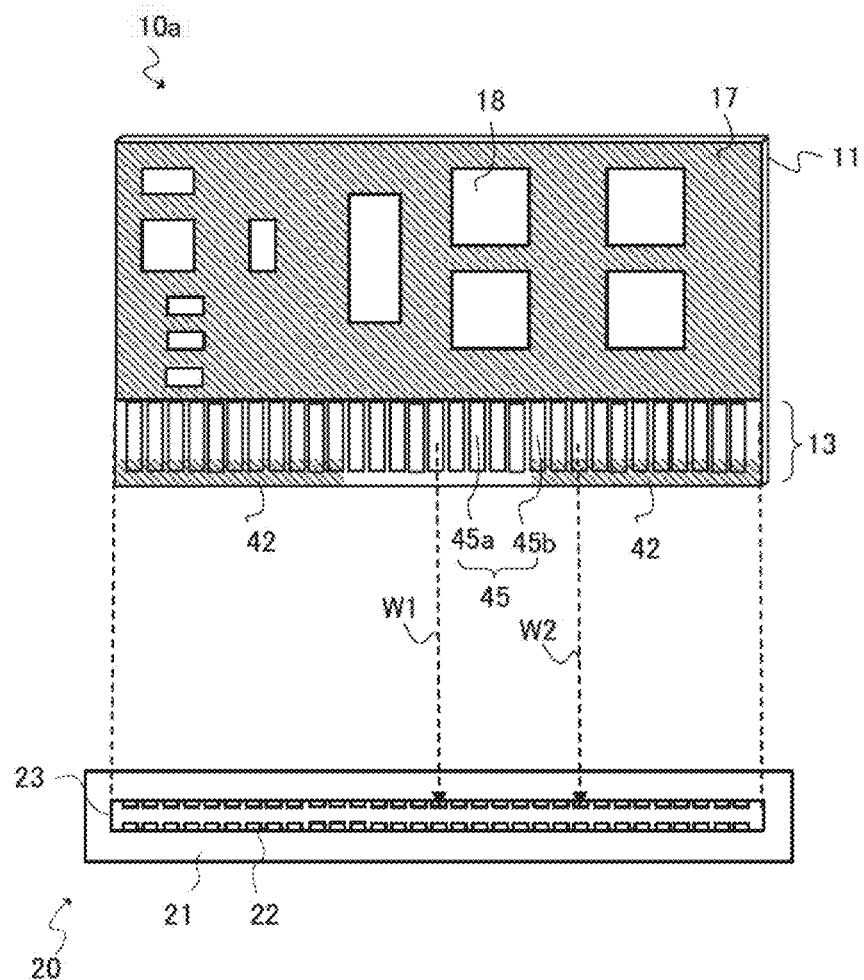
FIG. 7 illustrates a plane view of a function expansion device and a socket according to a second embodiment.

FIG. 7 illustrates a plane view indicating one example of the function expansion device 10a and of the socket 20 according to the second embodiment. With regard to structural members of the function expansion device 10a illustrated in FIG. 7, the same reference numerals as those in FIG. 2 are used for the function expansion device 10a.

In the same or similar manner to the connecting terminals 15 of the function expansion device 10 according to the first embodiment, connecting terminals 45 are formed in a given pattern at end portions on both sides of the connector portion 13 of a substrate 11 in the faction expansion device 10a. The connecting terminals 45 may be formed by etching copper sheet laminated on the substrate 11. Note, however, that the function expansion device 10a according to the second embodiment is different from the function expansion device 10 according to the first embodiment in that a surface of the connector portion 13 is divided into three (3) areas. First connecting terminals 45a are formed on a center area thereof, and second connecting terminals 45b are formed on the rest of the two (2) areas. Moreover the width of the first connecting terminal 45a is the same as or similar to that of the second connecting terminal 45b, and as indicated by dotted arrows W1 and W2, the first connecting terminal 45a and the second connecting terminal 45b are each connected to one (1) receiving terminal 22.

The plurality of second connecting terminals 45b is configured with connecting terminals, to each of which the same signal line is electrically connected. In other words, the signal line redundantly and electrically connecting components such as an IC chip 18 or the like arranged on the substrate 11 and the electronic apparatus is connected to the second connecting terminals 45b. Thus, even if electrical-contact failure has occurred between one (1) of the second connecting terminals 45b and the receiving terminal 22, an influence on an operation of the function expansion apparatus 10a may be suppressed, as long as the remaining second connecting terminals 45b, to which the same signal line that is electrically connected to the second connecting terminal 45b involved in the electrical-contact failure are connected, normally come in contact with the receiving terminal 22. As an example of the second connecting terminal 45b, for instance, a power supply terminal for supplying a power source or a grounding terminal serving as a reference of grounding potential may be considered. For example, if the function expansion device 10a includes the power supply terminal or the grounding terminal as the second connecting terminal 45b, a plurality of power supply terminals or the plurality of grounding terminals are disposed, respectively.

On the other hand, a signal line, which is not electrically connected to any of the connecting terminals except the first connecting terminal 45a, is electrically connected to the first connecting terminal 45a. That is to say, one (1) first connecting terminal 45a is the only connecting terminal to which the signal line that is not assigned to any of the remaining connecting terminals is electrically connected. In other words, the signal line, which is electrically connecting the components such as the IC chip 18 or the like arranged on the substrate 11 and the electronic apparatus in a one-to-one fashion, is electrically connected to the first connecting terminal 45a. In consequence, a signal sent and received between the one (1) first connecting terminal 45a and the electronic apparatus is not sent and received to and from any of the remaining connecting terminals. As an example of such first connecting terminal 45a, for instance, a signal terminal that sends and receives a data signal may be considered. Thus, if the electrical-contact failure has occurred between the first connecting terminal 45a and the receiving terminal 22, this may result in a significant influence on the operation of the function expansion device 10a.

In the function expansion device 10a according to the second embodiment, a protection member 42 is not provided at an end portion of the first connecting terminal 45a but provided only at an end portion of the second connecting terminal 45b. More specifically, similar to the case of the protection member 12 in the function expansion device 10 according to the first embodiment, the protection member 42 is provided adjacent to the end portion of the second connecting terminal 45b. A sectional view of a portion on which the first connecting terminals 45a in the connector portion 13 is formed is the same as the one in which the first connecting terminal 45a serves as the first connecting terminal 15a in the FIG. 3A indicated above. Moreover, the sectional view of the portion on which the second connecting terminal 45b in the connector portion 13 is formed is the same as the one in which the second connecting terminal 45b serves as the second connecting terminal 15b and the protection member 42 serves as the protection member 12 in FIG. 3B indicated above. Thus, similar to the case as disclosed in the first embodiment, by providing the protection member 42 adjacent to the end portion of the second connecting terminal 45b, not only an operation of protecting the end portion of the second connecting terminal 45b against shock or the like may be achieved, but also an operation of reducing insertion force upon insertion of the connector portion 13 in the socket 20 may be achieved.

Since the protection member 42 is provided at the portion on which the second connecting terminal 45b in the connector portion 13 is provided, the reduction in insertion force may be achieved upon insertion of the connector portion 13 in the socket 20. However, a part of the protection member 42 may be scraped off by the receiving terminal 22 at the portion on which the second connecting terminal 45b in the connector portion 13 is provided, and thereby there is a possibility that flakes of the protection member 42 may be caught between the second connecting terminal 45b and the receiving terminal 22. On the other hand, no protection member 42 is provided at a portion on which the first connecting terminal 45a in the connector portion 13 is provided.

Consequently, there is no possibility that the flakes of the protection member 42 are caught therebetween at the portion on which the first connecting terminal 45a in the connector portion 13 is provided.

Figure 8:
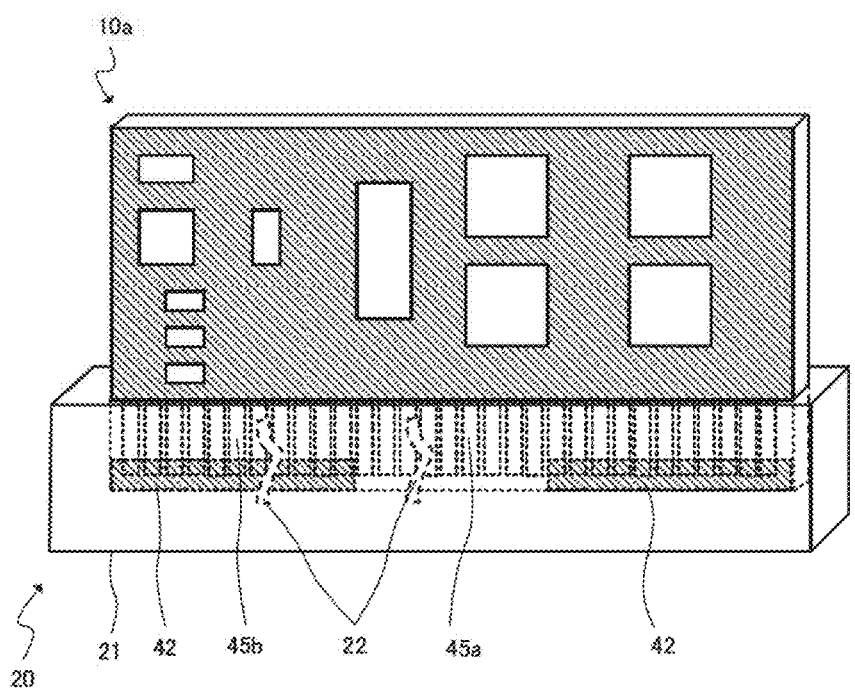
FIG. 8 illustrates a transparent view indicating one example of a state where the connector portion is completely inserted in the socket.

FIG. 8 illustrates a transparent view indicating one example of a state where the connector portion 13 is completely inserted in the socket 20. In FIG. 8, only a part of the receiving terminals 22 in the plurality of receiving terminals 22 are indicated.

When the connector portion 13 is completely inserted in the socket 20, the first connecting terminal 45a and the second connecting terminal 45b come in contact with one (1) receiving terminal 22, respectively. By virtue thereof, electrical connection is established between the first connecting terminal 45a and the receiving terminal 22 and between the second connecting terminal 45b and the receiving terminal 22, respectively.

There is almost no influence on the operation of the function expansion device 10a even if the electrical-contact failure has occurred at one (1) of the second connecting terminals 45b by the flakes of the protection member 42 having been caught between the second connecting terminal 45b and the receiving terminal 22. As disclosed above, it is because that the electrical connection with the electronic apparatus is maintained by virtue of the remaining second connecting terminals 45b to which the same signal line that is electrically connected to the second connecting terminal 45b involved in the electrical-contact failure is electrically connected. In other words, there is no influence on the operation of the function expansion apparatus 10a, unless the electrical-contact failure occurs to all the remaining second connecting terminals 45b to which the same signal line that is electrically connected to the second connecting terminal 45b involved in the electrical-contact failure is electrically connected. On the other hand, no protection member 42 is provided at the end portion of the first connecting terminal 45a. In consequence, there is no possibility that the electrical-contact failure occurs due to the flakes of the protection members 42 having been caught between the first connecting terminal 45a and the receiving terminal 22.

In the function expansion device 10a according to the second embodiment disclosed above, the first connecting terminal 45a and the second connecting terminal 45b each come in contact with one (1) receiving terminal 22. The first connecting terminal 45a is the only connecting terminal to which a signal line that does not occupy any of the remaining connecting terminals is electrically connected. The second connecting terminal 45b is the connecting terminal to which the same signal line that is electrically connected to any of the remaining connecting terminals is electrically connected. The protection member 42 is not provided at the end portion of the first connecting terminal 45a but is provided only at the end portion of the second connecting terminal 45b in the function expansion device 10a. By virtue thereof, the insertion force may be reduced owing to the protection member 42 thus formed, in comparison to a function expansion device where no protection member is formed. On the other hand, with regard to the first connecting terminal 45a, since the protection member 42 is not provided thereon, the electrical-contact failure due to the flakes having been scraped off from the protection member 42 may be prevented. Moreover, the influence on the operation of the function expansion device 10a may be reduced even if the electrical-contact failure has occurred due to the flakes of the protection member 12 or 42 having been caught between the any of the second connecting terminals 45b and the receiving terminal 22, according to the function expansion device 10a. It is because that, even in the case disclosed above, the electrical connection with the electronic apparatus may be maintained by any of the remaining second connecting terminals 45b to which the same signal line that is electrically connected to the second connecting terminal 45b involved in the electrical-contact failure is electrically connected.

Note that the method disclosed in the second embodiment may be applicable to the function expansion apparatus 10 according to the first embodiment.

That is, the protection member 12 may be provided at the end portion of the first connecting terminal 15a if connection of a signal line that is the same as the first connecting terminal 15a connected to one (1) of the receiving terminals is assigned to any of the remaining connecting terminals in the function expansion apparatus 10 according to the first embodiment. By virtue thereof, not only the reduction in insertion force may be more effectively achieved but also the suppression or the reduction in the influence on the operation of the function expansion apparatus may be achieved. Hereinafter, for convenience of description, the first connecting terminal is described as the only connecting terminal to which a signal line that is not assigned to any of the remaining connecting terminals is electrically connected.

The descriptions disclosed in the above first and the second embodiments is summarized as follows. The function expansion device according to the embodiments includes the first connecting terminal and the second connecting terminal. The first connecting terminal is the connecting terminal to which a signal line whose electrical connection with the electronic apparatus is not made redundant is electrically connected. More specifically, the first connecting terminal comes in contact with one (1) of the receiving terminals of the socket and the first connecting terminal is the only connecting terminal to which the signal line that is not electrically connected to any of the remaining connecting terminals is electrically connected.

On the other hand, the second connecting terminal is the connecting terminal to which the signal line whose electrical connection with the electronic apparatus is made redundant is electrically connected. More specifically, the second connecting terminal is the connecting terminal which comes in contact with the plurality of receiving terminals of the socket or the receiving terminals to which the same signal line that is electrically connected to any of the remaining connecting terminals are electrically connected. In the function expansion device according to the first and the second embodiments, the protection member is formed adjacent to the end portion of the second connecting terminal to which the signal line that is made redundant is electrically connected.

With the configuration disclosed above, the insertion force may be reduced owing to the protection member thus formed, in comparison to the function expansion device where no protection member is formed. On the other hand, the electrical-contact failure due to a piece of the protection member, which has been scraped off, may be prevented, with regard to the first connecting terminal to which the signal line whose electrical connection with the electronic apparatus is not made redundant is electrically connected. In addition, since the signal line, which is made redundant for the electrical connection with the electronic apparatus, is electrically connected to the second connecting terminal formed adjacent to the protection member, the influence on the operation of the function expansion device may be reduced, even if, for example, the electrical-contact failure occurred due to a piece of the protection member having been scraped off between one (1) of the second connecting terminals and one (1) of the receiving terminals.

Note that the connecting terminals 15 are formed on both surfaces of the connector portion 13 of the substrate 11 in the function expansion devices 10 or 10a according to the first and the second embodiments, however the function expansion device is not limited thereto. Instead, the connecting terminals 15 may be formed only on either surface of the connector portion 13.

In the function expansion device 10 according to the first embodiment, one surface of the connector portion 13 is divided into the right area and the left area, and the first connecting terminals 15a are formed on one of the areas, and the second connecting terminals 15b are formed on the remaining area. On the other hand, one surface of the connector portion 13 is divided into three (3) areas, and the first connecting terminals 45a are formed on the center area, whereas, the second connecting terminals 45b are formed on the remaining areas, in the function expansion device 10a according to the second embodiment. However, configuration of the first connecting terminals and the second connecting terminals are not limited thereto, and any configuration may be applicable. For example, the first connecting terminals and the second connecting terminals may be formed in an alternate configuration on one surface of the connector portion 13 of the substrate 11. Whatever configuration is employed for the first connecting terminals and the second connecting terminals, the same or similar effects as those disclosed in the first and the second embodiments may be achieved by providing the protection member at the end portion of the second connecting terminal.

Figure 9A:
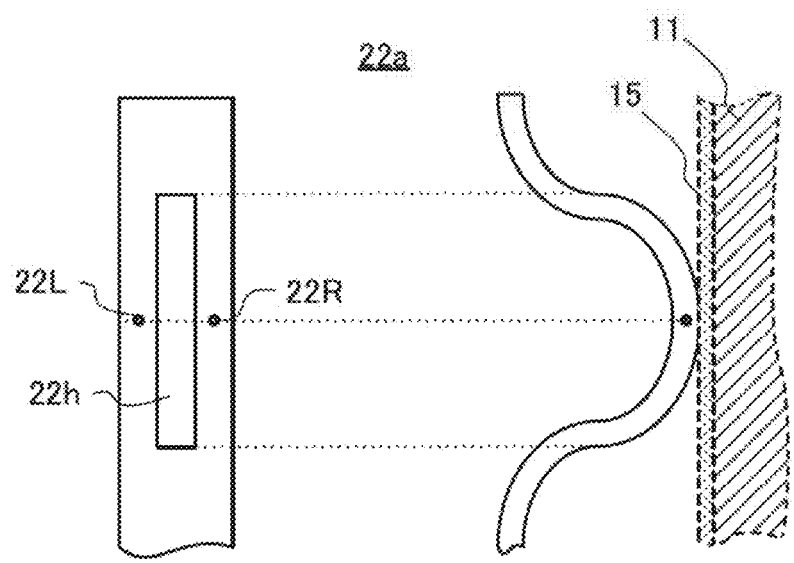
FIGS. 9A and 9B illustrate views indicating one example of contact points and a first connecting terminal according to a modification of the embodiments.

FIG. 9A illustrates a view indicating a receiving terminal 22a according to another embodiment. In FIG. 9A, a figure on the left illustrates a plane view of the receiving terminal 22a according to the embodiment and a figure on the right illustrates a sectional view of the receiving terminal 22a according to the embodiment.

When it comes to the receiving terminal 22*a* according to FIG. 9, an opening 22*h* is disposed at a position where the receiving terminal 22*a* comes in contact with a connecting terminal 15. By virtue thereof, the receiving terminal 22*a* is configured such that the receiving terminal 22*a* is provided with two (2) separate contact points, so that the connecting terminal 15 comes in contact with two (2) separate contact points 22L and 22R in the receiving terminal 22*a*. In consequence, the second connecting terminal 15*b* that comes in contact with the plurality of receiving terminals 22 is formed wider in width than the first connecting terminal 15*a* attached by pressure to one (1) receiving terminal, according to the first embodiment disclosed above. Note, however, that the embodiment is not limited thereto. Like the example indicated by FIG. 9A, even in the connecting terminal that comes in contact with one (1) receiving terminal, when the one (1) receiving terminal is provided with a plurality of separate contact points and is connected to the separate contact points, the protection member may be provided on the connecting terminal. By virtue thereof, the same or similar effects as those in the first embodiment may be achieved.

Figure 9B:
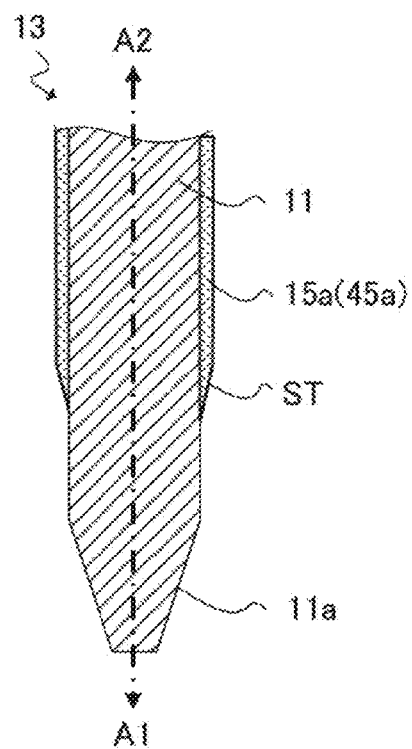

FIG. 9B illustrates a sectional view of the first connecting terminal according to the embodiment.

In the first and the second embodiments, for example, as indicated by FIG. 3, the end portion of the first connecting terminal 15*a* (45*a*) where no protection member is formed undergoes no specific process. However, as indicated by FIG. 9B, a slanted surface ST may be formed by removing a portion of the end portion with use of a pressing process, a cutting process or the like on the end portion of the first connecting terminal 15*a* (45*a*) on which no protection member is formed. By virtue thereof, with regard to a portion on which the first connecting terminal 15*a* (45*a*) in the connector portion 13 is formed, the insertion force upon inserting the above-disclosed portion in a socket 20 may be reduced. Consequently, a reduction in stress upon inserting the connector portion in the socket may be achieved, even if the stress is concentrated on the portion, on which the first connecting terminal in the connector portion is provided, caused by the protection member provided at the end portion of the second connecting terminal 15*b* (45*b*).

A method of manufacturing the function expansion device according to the embodiments will be disclosed with reference to FIGS. 10 through 12. FIG. 10 illustrates a flow chart indicating one example of the method of manufacturing the function expansion device according to the embodiments. FIGS. 11A and 11B illustrate plane views indicating one example of the function expansion device as a part of manufacturing processes. FIGS. 12A through 12D illustrate sectional views indicating one example of the function expansion device in each of the manufacturing processes. Hereinafter, as an example, descriptions are made based on processes of manufacturing the function expansion device 10 according to the first embodiment.

First, a metal film, for example, copper foil or the like, is disposed on both surfaces of a substrate 11 formed of a glass epoxy resin or the like in procedure P101. Next, wiring patterns 16 and connecting terminals 15 are formed on both surfaces of the substrate 11 by etching the metal film with a desired pattern. FIG. 11A illustrates a plane view indicating a state where the wiring patterns 16 and the connecting terminals 15 are formed on the surface of the substrate 11. Note that FIG. 12A indicates a sectional view taken along the section line C1-C2 in the plane view of FIG. 11A. Then, the process goes to procedure P102.

Figure 12A:
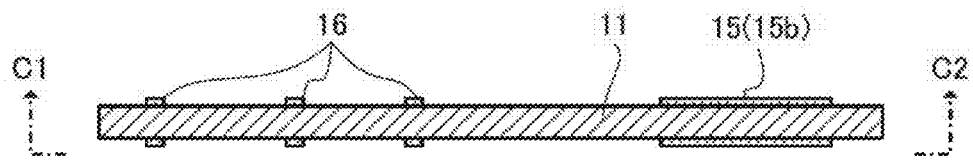
FIGS. 12A through 12D illustrate sectional views indicating one example of the function expansion device in each of the manufacturing processes.
Figure 12B:
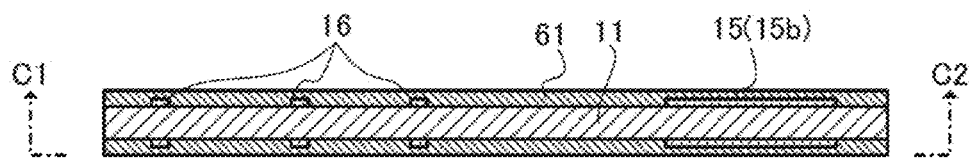

In the procedure P102, as indicated by FIG. 12B, a resist material 61 is applied on both surfaces of the substrate 11 by using a screen printing method or the like. Then, the resist material 61 applied on both surfaces of the substrate 11 is dried by using a far-infrared furnace, an air-heating furnace or the like. Thereafter the process goes to procedure P103.

Figure 12C:
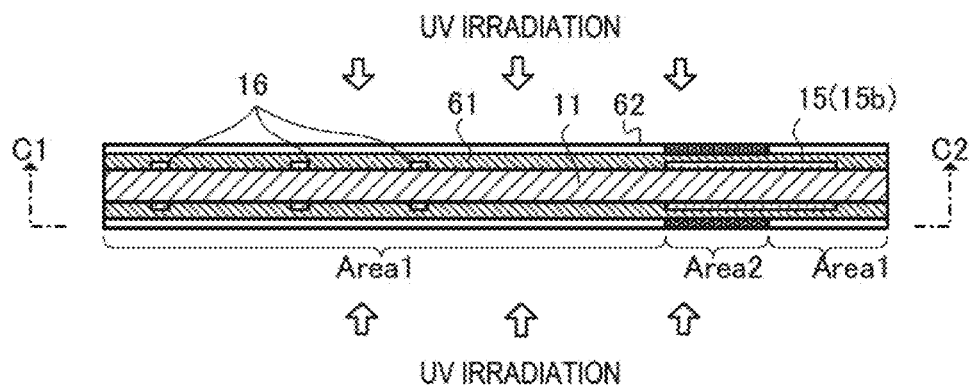

In the procedure P103, as indicated by FIG. 12C, a negative mask 62 is disposed on a surface of the resist material 61 applied on both surfaces of the substrate 11. Thereafter, the resist material 61 is exposed to ultra-violet rays or the like through the negative mask 62. As a result, a part of the resist material 61 is exposed, so that the resist material 61 is hardened corresponding to a pattern of the negative mask 62. The pattern of the negative mask 62 is formed on the surface of the substrate 11, on which the resist material 61 is applied, in such a manner that an area with the wiring patterns 16 being formed and an area for an end portion of a second connecting terminal 15*b* are exposed whereas the rest of the area is not exposed. In FIG. 12C, the area that undergoes exposure is indicated by white, that is, an area Area1, and the area that does not undergo the exposure is indicated by black, that is, an area Area2, in the negative mask 62. By exposing through the negative mask 62, the resist material 61 is hardened on the area with the wiring patterns 16 being formed and the area for the end portion of the second connecting terminal 15*b* at the same time. With the method disclosed above, formation of a protective resist 17 that protects the wiring patterns 16 and of the protection member 12 is achieved together. Thereafter the process goes to a procedure P104.

Figure 12D:
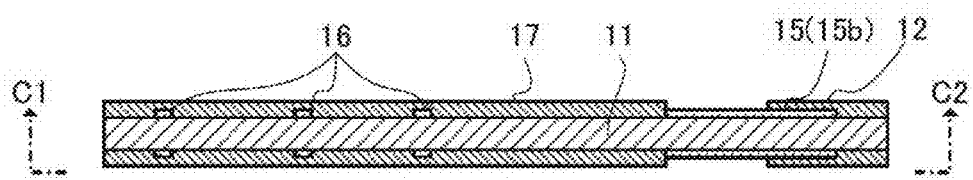

In the procedure P104, as indicated by FIG. 12D, a part that did not undergo the exposure and is not hardened in the resist material 61 applied on both surfaces of the substrate 11 is removed by using a developing solution or the like for this purpose. As a result, the resist material 61 remains on the area with the wiring patterns 16 and the area for the end portion of the second connecting terminal 15*b*. On the other hand, the rest of the area, for example, the resist material 61 is removed on the area that comes in contact with receiving terminals 22 of a socket 20. In consequence, the protective resist 17 that protects the wiring patterns 16 and the protection member 12 are formed on both surfaces of the substrate 11. FIG. 11B illustrates a plane view indicating a state where the protective resist 17 and the protection member 12 are formed on the substrate 11. In this way, the substrate 11 of the function expansion device 10 is completed. After completion of the procedure P104, a variety of IC chips 18 are mounted on the substrate 11 and interconnected with the wiring patterns, thereby the function expansion device 10 is completed.

In FIG. 11B, the area Area1 that underwent the exposure and the area Area2 that did not undergo the exposure in the procedure P103 are indicated by the dashed line. More specifically, the area Area1 is the area with the wiring patterns 16 being formed and the area for the end portion of the second connecting terminal 15*b*. The area Area2 is a part of the area for the second connecting terminal 15*b*, which comes in contact with the receiving terminals 22 of the socket 20, and an entire area of the first connecting terminals 15*a*. The negative mask 62 is pattern-formed in such a manner that the area Area1 undergoes the exposure and the area Area2 does not undergo the exposure. By using the pattern-formed negative mask 62, the resist material 61 applied only on the area with the wiring patterns 16 being formed and the area for the end portion of the second connecting terminal 15*b* may be hardened at the same time.

As is apparent from the descriptions disclosed above, since the protective resist protecting the wiring patterns and the protection member are formed at the same time, it is not necessary to add any new and particular manufacturing process for forming the protection member in the manufacturing method of the function expansion device according to the embodiments. Moreover, whatever a position and/or a shape of the protection member may be, use of the pattern-formed negative mask corresponding to the position and/or the shape of the protection member allows the possibility of an increase in processes resulting from the positions or shapes thereof to be significantly reduced. Therefore, whatever the configuration of the first connecting terminals and the second connecting terminals and/or the widths of the respective connecting terminals may be, it is possible to provide the protection member only on the end portion of the second connecting terminals without increasing the manufacturing processes in comparison to commonly-used manufacturing methods of commonly-used function expansion devices, in the method of manufacturing the function expansion device according to the embodiments.

Hereinafter, examples of the applications of the function expansion device according to the embodiments will be disclosed. As disclosed above, as examples of the function expansion device according to the embodiments, there may be mentioned, for example, a power supply module, a memory module, a CPU module, a network card or the like. In these function expansion devices, as an example of the connecting terminal to which a signal line whose electrical connection with an electronic apparatus is made redundant is connected (hereinafter, only referred to as a "redundant connecting terminal"), there may be mentioned here a non-connected terminal (hereinafter referred to as an "NC terminal" or a "dummy terminal") connected to none of the power supply terminal, the grounding terminal, the electronic apparatus, and components on a substrate 11.

First, as the example of the function expansion device, an example in which the embodiments are applied to a direct current-direct current converter (DC/DC converter) serving as a power supply module will be disclosed.

FIG. 13 illustrates one example of assignment tables for the connecting terminals (pins) of the DC/DC converter module with reference to the A-D2D standard in the Server System Infrastructure Specification (SSI specification). In FIG. 13, connecting terminals indicated as "48 Vin" and "Vout+" are the power supply terminals and connecting terminals indicated as "48Vrtn" and "Vout−" are the grounding terminals. Moreover, connecting terminals indicated by "Reserved" are the NC terminals (dummy terminals). These connecting terminals are enclosed by bold line frames in the assignment table of the connecting terminals indicated by FIG. 13. In the example indicated by FIG. 13, the number of the power supply terminals, the grounding terminals, and the NC terminals is 26 among the total number of 36 connecting terminals. As is apparent from FIG. 13, a plurality of connecting terminals is allocated for the power supply terminal, the grounding terminal, and the NC terminal, respectively. For this reason, it is possible to say that the power supply terminals, the grounding terminals, and the NC terminals are made redundant.

On the other hand, the number of remaining connecting terminals (that is to say, the connecting terminals to which usual signal lines except for the power supply terminals, the grounding terminals, and the NC terminals are electrically connected) is 10. In the example indicated by FIG. 13, it is possible to say that each of the connecting terminals to which the ordinary signal line is electrically connected is not made redundant because electrical connection of the same signal line is allocated to none of the remaining connecting terminals except the connecting terminal. Note that if connecting terminals whose widths are different are formed as disclosed in the first embodiment, one (1) connecting terminal is configured such that a connecting terminal group to which the same signal line is electrically connected (such as, pin numbers 1 to 3, pin numbers 4 and 5, pin numbers 13 and 14, and pin numbers 16 and 17) forms the one (1) connecting terminal.

Consequently, it is possible to say that approximately 70 percent of the connecting terminals are made redundant in the DC/DC converter module with reference to the A-D2D standard in the SSI specification. In the above case, by providing protection members on the end portions of the redundant connecting terminals, the insertion force necessary for inserting a connector portion in a socket may be reduced up to approximately 30 percent in comparison to the case where no protection member is provided.

Next, as another example of the function expansion device, a dual inline memory module (DIMM), which is a type of memory modules, is applied to the embodiments.

Figure 14A:
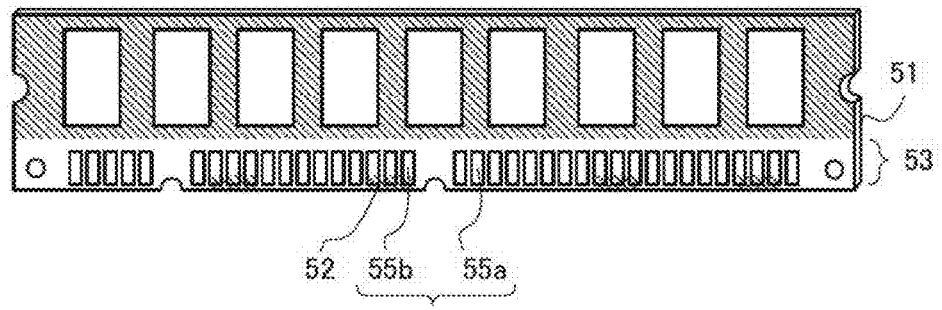

FIG. 14A illustrates a plane view indicating one example of the DIMM. FIG. 14B illustrates one example of assignment tables for connecting terminals (pins) of the DIMM having 168 connecting terminals.

In the example of the DIMM indicated by FIG. 14A, connecting terminals 55 are disposed on a connector portion 53 of a substrate 51. A first connecting terminal 55a is a connecting terminal that is not made redundant, and a second connecting terminal 55b is a connecting terminal that is made redundant. Even in the example of the DIMM, the same or similar effect to the embodiments may be achieved by providing the protection member 12 only at an end portion of the second connecting terminal 55b.

In FIG. 14B, "$V_{DD}$" indicates a power supply terminal, "$V_{SS}$" indicates a grounding terminal, and "NC" indicates an NC terminal (dummy terminal). In the assignment tables for connecting terminals indicated by FIG. 14B, these connecting terminals are enclosed by the bold line frames. In the example indicated by FIG. 14B, the number of power supply terminals, grounding terminals, and NC terminals is 48 in the total number of 168 connecting terminals. A plurality of connecting terminals is allocated to the power supply terminal, the grounding terminal, and the NC terminal, respectively. In consequence, it is possible to say that the power supply terminals, the grounding terminals, and the NC terminals are made redundant. On the other hand, the number of connecting terminals which are neither the power supply terminal nor the grounding terminal nor the NC terminal is 120. With regard to each of the connecting terminals in the example indicated by FIG. 14 (that is to say, neither the power supply terminal, the grounding terminal, nor the NC terminal), it is possible to say that these terminals are not made redundant because electrical connection of the same signal line is not allocated to any of the remaining connecting terminals except the connecting terminal.

Thus, it is possible to say that approximately 30 percent of the connecting terminals are the ones that are made redundant in the DIMM having 168 connecting terminals. In the above case, by providing the protection member at the end portion of the redundant connecting terminal, insertion force necessary upon insertion of the connector portion in the socket may be reduced up to approximately 70 percent in comparison to the case where no protection member is provided.

Note that examples to which the embodiments disclosed above are applicable are not limited to the DC/DC converter module and the DIMM. It is needless to say that the embodiments disclosed above may be applicable to function expansion devices if the function expansion devices have connecting terminals that are made redundant. In addition, for instance, there may be a case where an NC terminal is newly provided for a function expansion device (for example, other PCI cards like a fiber channel adapter card, a sound card or the like, and a ROM cartridge or the like) that does not have connecting terminals that are made redundant so as to prepare for potential expansion of a data bus. In the above case, by providing the protection member at an end portion of the NC terminal that is newly provided, the insertion force may be reduced in comparison to the case where no protection member is provided.

The present embodiments are by no means limited to particular embodiments but various variations and modifications may be made without departing from the scope of the embodiments.

What is claimed is:

1. A function expansion device that is electrically connected to an electronic apparatus by being inserted in a socket included in the electronic apparatus and expands a function of the electronic apparatus, the function expansion device comprising:
   a substrate on which a component is mounted;
   a first connecting terminal that is formed at an end portion of the substrate and is electrically connected to a first signal line that connects the electronic apparatus and the component in a one-to-one fashion;
   a second connecting terminal that is formed at the end portion of the substrate and is electrically connected to a second signal line that connects the electronic apparatus and the component redundantly; and
   a protection member that is formed to cover the second connecting terminal and expose the first connecting terminal.

2. The function expansion device according to claim 1, wherein the first connecting terminal is electrically connected only to one receiving terminal included in the socket, and the second connecting terminal is electrically connected to a plurality of the receiving terminals included in the socket.

3. The function expansion device according to claim 2, wherein the second connecting terminal is wider in width than the first connecting terminal.

4. A function expansion device that is electrically connected to an electronic apparatus by being inserted in a socket included in the electronic apparatus, and expands a function of the electronic apparatus, the function expansion device comprising:
   a substrate on which a component is mounted;
   a first connecting terminal that is formed at an end portion of the substrate and is electrically connected to a first signal line that connects the electronic apparatus and the component in a one-to-one fashion;
   a dummy terminal that is formed at the end portion of the substrate and is electrically connected neither to the electronic apparatus nor to the component; and
   a protection member that is formed to cover a second connecting terminal and expose the first connecting terminal.

5. An electronic apparatus system that includes an electronic apparatus and a function expansion device that expands a function of the electronic apparatus by being electrically connected to the electronic apparatus, the function expansion device comprising:
   a substrate on which a component is mounted;
   a first connecting terminal that is formed at an end portion of the substrate and is electrically connected to a first signal line that electrically connects the electronic apparatus and the component in a one-to-one fashion;
   a second connecting terminal that is formed at the end portion of the substrate and is electrically connected a second signal line that redundantly connects the electronic apparatus and the component;
   a protection member that is formed to cover the second connecting terminal and expose the first connecting terminal, and
   the electronic apparatus includes a socket that includes a third connecting terminal provided corresponding to the first connecting terminal and a fourth connecting terminal provided corresponding to the second connecting terminal.

6. The electronic apparatus system according to claim 5, wherein
   the first connecting terminal is electrically connected only to one receiving terminal included in the socket, and
   the second connecting terminal is electrically connected to a plurality of receiving terminals included in the socket.

7. The electronic apparatus system according to claim 6, wherein the second connecting terminal is wider in width than the first connecting terminal at the end portion of the substrate.

8. An electronic apparatus system that includes an electronic apparatus and a function expansion device that expands a function of the electronic apparatus by being electrically connected to the electronic apparatus, the function expansion device comprising:
   a substrate on which a component is mounted;
   a first connecting terminal that is formed at an end portion of the substrate and connects electrically to a first signal line in a one-to-one fashion between the electronic apparatus and the component;
   a dummy terminal that is formed at the end portion of the substrate and electrically connected neither to the electronic apparatus nor to the component; and
   a protection member that is formed to cover a second connecting terminal and expose the first connecting terminal,
   the electronic apparatus includes a socket that includes a first connecting terminal provided corresponding to the first connecting terminal.

9. A method of manufacturing a substrate of a function expansion device that is electrically connected to an electronic apparatus by being inserted in a socket included in the electronic apparatus, and expands a function of the electronic apparatus, the method comprising:
   forming a wiring pattern on a surface of the substrate and forming a plurality of connecting terminals at an end portion of the substrate;
   applying a resist material on a surface of the substrate;
   hardening the resist material applied on an area of the substrate on which the wiring pattern is formed, and applied on an area of a second connecting terminal to which a signal line is electrically and redundantly connected to a plurality of connecting terminals of the electronic apparatus; and
   forming a protection member to cover the second connecting terminal and expose a first connecting terminal.

10. A method of manufacturing a substrate of a function expansion device that is electrically connected to an electronic apparatus by being inserted in a socket included in the electronic apparatus and expands a function of the electronic apparatus, the method comprising:
   forming a wiring pattern on a surface of the substrate and forming a plurality of connecting terminals at an end portion of the substrate;
   applying a resist material on the surface of the substrate;
   hardening the resist material applied on an area of the substrate on which the wiring pattern is formed, and applied on an area of the substrate in which a dummy terminal is formed, the dummy terminal being electrically connected neither to the electronic apparatus nor to a component mounted to the substrate; and forming a protection member to cover a second connecting terminal and expose a first connecting terminal.

* * * * *